US011266037B2

(12) United States Patent
Tsorng et al.

(10) Patent No.: US 11,266,037 B2
(45) Date of Patent: Mar. 1, 2022

(54) FAN MODULE WITH PIVOTING LEVER AND EFFICIENT SPACE UTILIZATION

(71) Applicant: QUANTA COMPUTER INC., Taoyuan (TW)

(72) Inventors: Yaw-Tzorng Tsorng, Taoyuan (TW); Chun Chang, Taoyuan (TW); Zhi-Hao Tseng, Taoyuan (TW); Yu-Cheng Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 274 days.

(21) Appl. No.: 16/440,474

(22) Filed: Jun. 13, 2019

(65) Prior Publication Data

US 2020/0396862 A1 Dec. 17, 2020

(51) Int. Cl.
*H05K 7/20* (2006.01)
*G06F 1/20* (2006.01)
*F04D 25/16* (2006.01)
*F04D 29/52* (2006.01)
(Continued)

(52) U.S. Cl.
CPC ....... *H05K 7/20172* (2013.01); *F04D 25/166* (2013.01); *F04D 29/522* (2013.01); *F04D 29/646* (2013.01); *G06F 1/20* (2013.01); *F04D 25/08* (2013.01)

(58) Field of Classification Search
CPC .... F04D 29/646; F04D 25/166; F04D 29/522; F04D 25/08; H05K 5/0221; H05K 5/023; H05K 7/20172; H05K 7/20718; H05K 7/20736; H01L 23/40
See application file for complete search history.

(56) References Cited

U.S. PATENT DOCUMENTS

| 10,568,237 | B2 * | 2/2020 | Yu ..................... H05K 7/20736 |
| 2005/0111191 | A1 | 5/2005 | Lee et al. |
| 2014/0184040 | A1 | 7/2014 | Li |

FOREIGN PATENT DOCUMENTS

| CN | 103906414 A | 7/2014 |
| CN | 205689464 U | 11/2016 |
| CN | 106194851 A | 12/2016 |

(Continued)

OTHER PUBLICATIONS

TW Office Action for Application No. 108134512, dated May 28, 2020, w/ First Office Action Summary.

(Continued)

*Primary Examiner* — Christopher Verdier
(74) *Attorney, Agent, or Firm* — Nixon Peabody LLP

(57) ABSTRACT

A fan module containing a fan is used to cool a computing device or system. The fan module is mounted within a chassis, and contains a housing, a locking body, and lever. The housing of the fan module contains a housing, a locking body, and lever. The housing of the fan module defines a hollow interior that houses the fan. The locking body is coupled to the housing and is moveable between a locked position and an unlocked position. When in the locked position, the locking body extends through a locking aperture in the floor of the chassis. When in the unlocked position, the locking body rises above the locking aperture in the floor of the chassis. Moving the lever from the first position to the second position causes the locking body to move from the locked position to the unlocked position.

20 Claims, 11 Drawing Sheets

(51) Int. Cl.
*F04D 29/64* (2006.01)
*F04D 25/08* (2006.01)

(56) References Cited

FOREIGN PATENT DOCUMENTS

| | | |
|---|---|---|
| CN | 206983792 U | 2/2018 |
| EP | 3190477 A1 | 7/2017 |
| JP | H05-018079 U | 3/1993 |
| TW | M566760 U | 9/2018 |

OTHER PUBLICATIONS

TW Search Report for Application No. 108134512, dated May 28, 2020, w/ First Office Action.
JP Office Action for Application No. 2020-040813, dated May 6, 2021, w/ First Office Action Summary.
Extended European Search Report for EP Application No. 19203177.1, dated May 8, 2020.
CN Office Action for Application No. 201910957164.6, dated Aug. 31, 2021, w/ First Office Action Summary.
CN Search Report for Application No. 201910957164.6, dated Aug. 31, 2021, w/ First Office Action.

\* cited by examiner

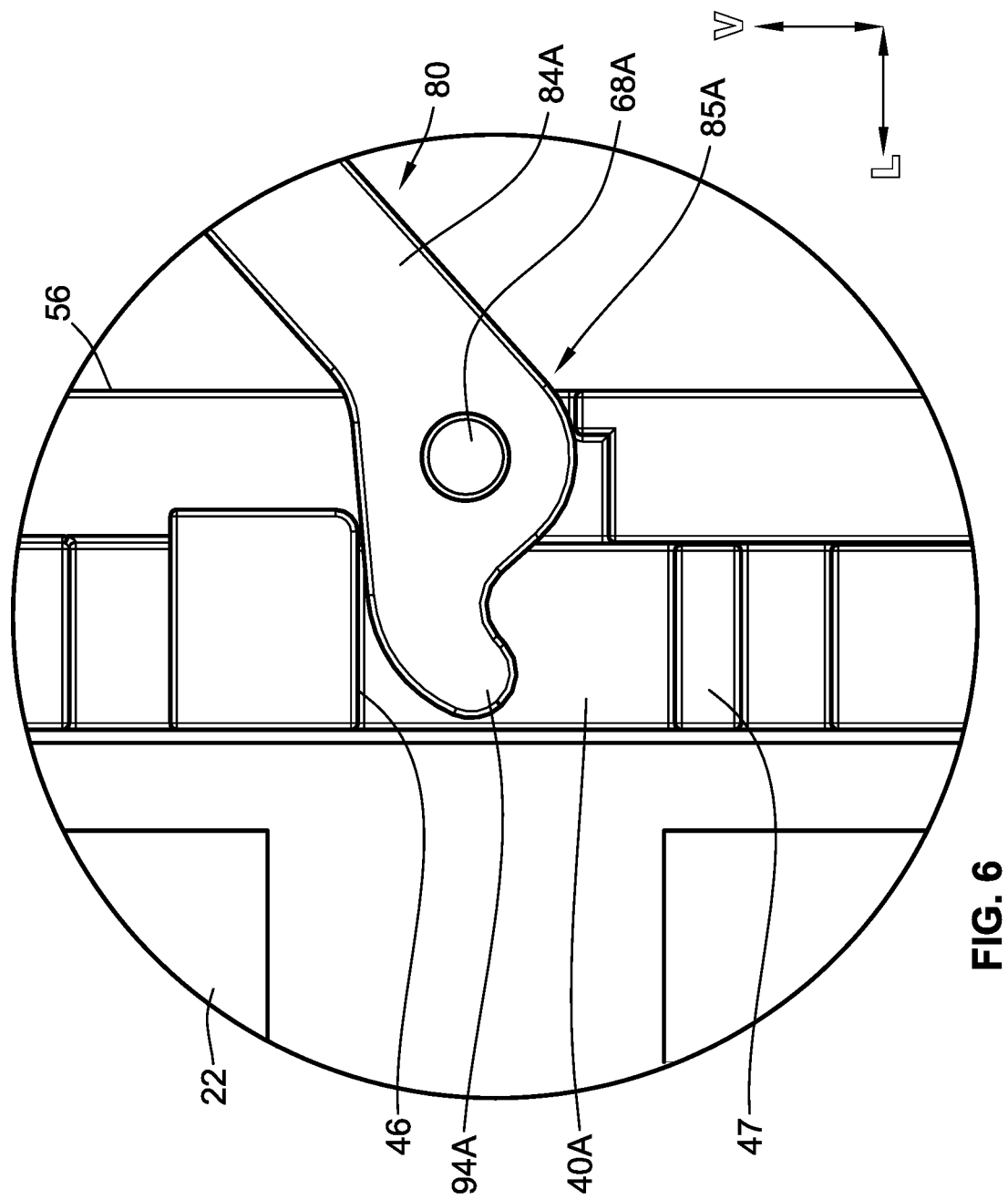

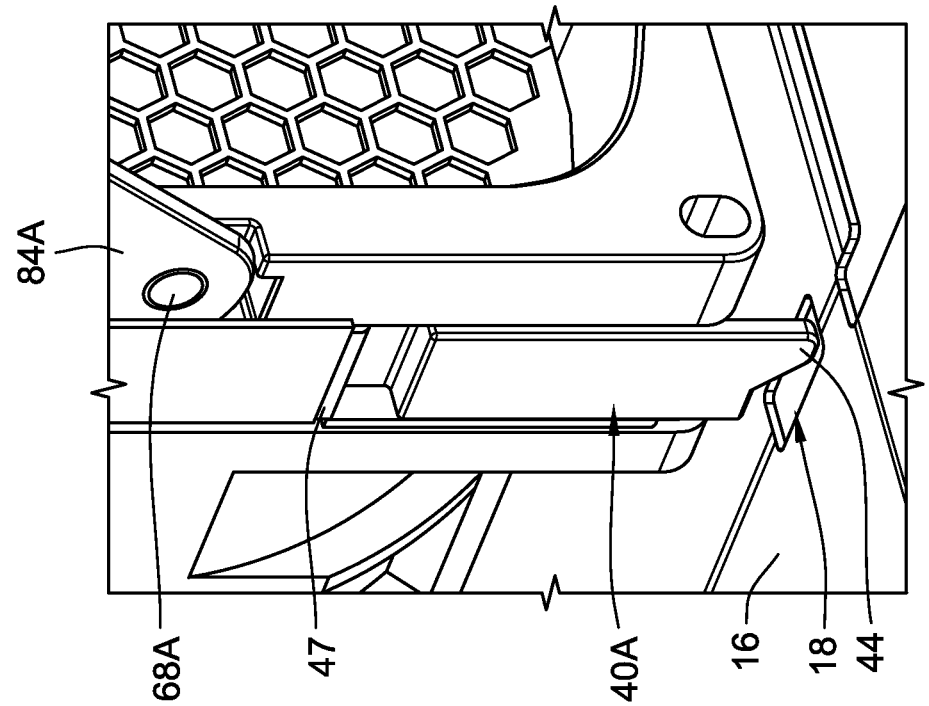
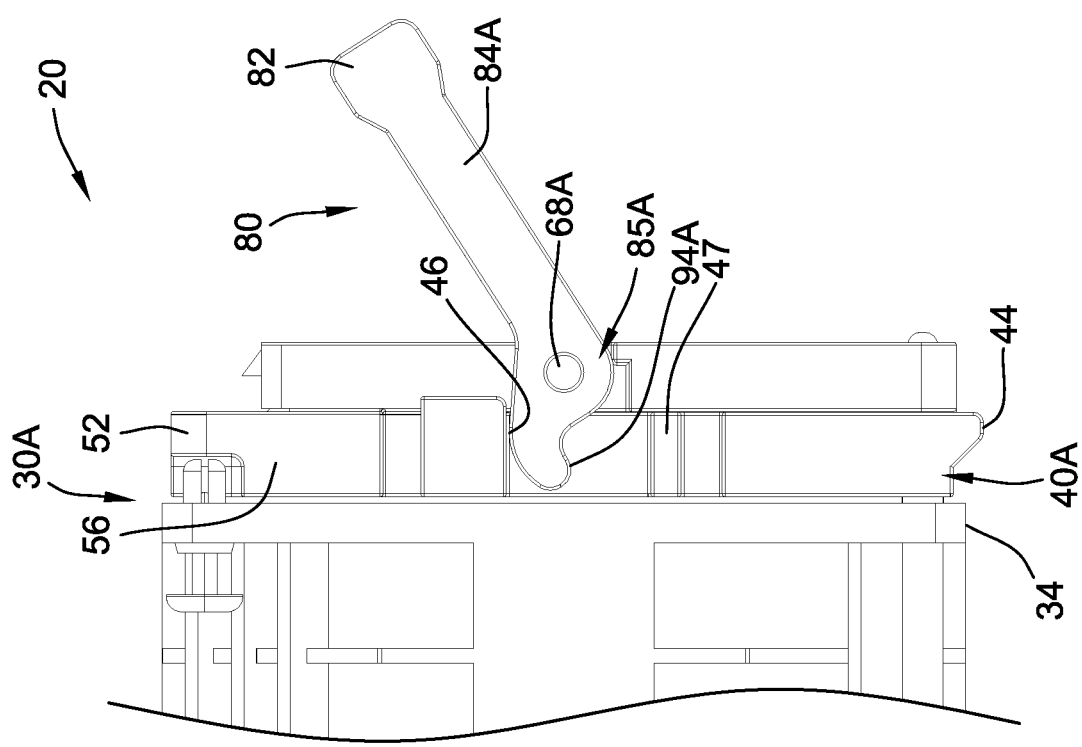

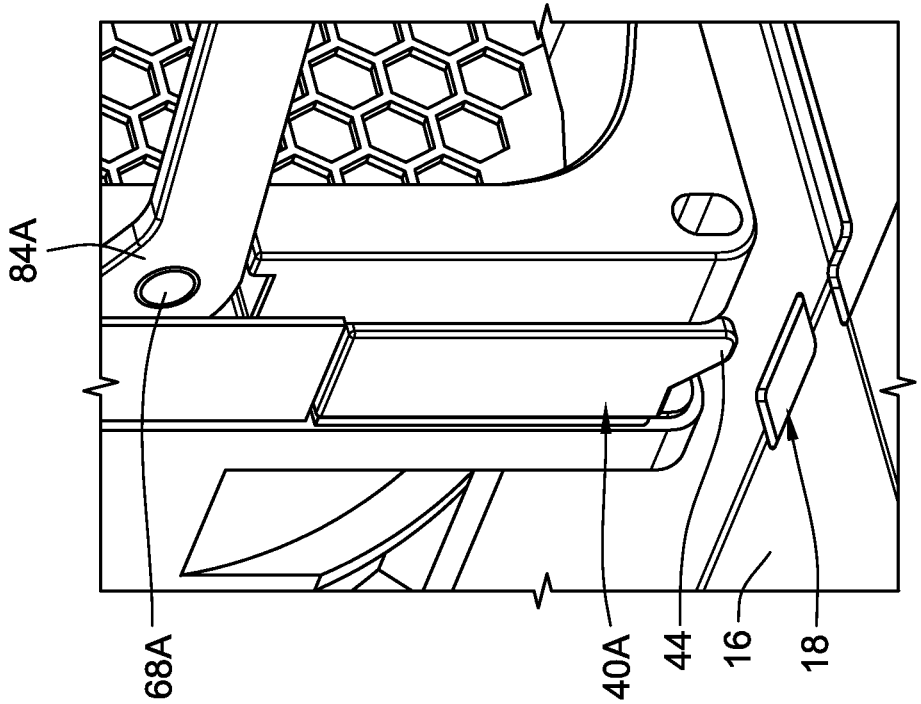
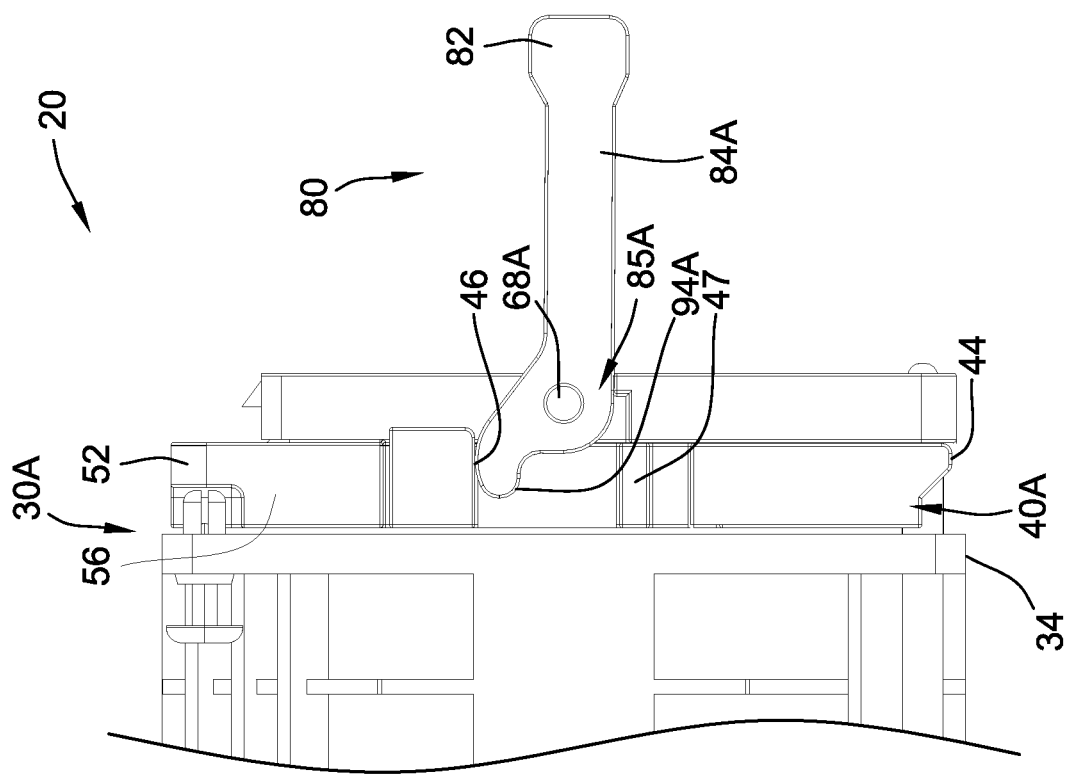

FAN MODULE WITH PIVOTING LEVER AND EFFICIENT SPACE UTILIZATION

TECHNICAL FIELD

The present disclosure relates generally to a fan module for cooling a computing device or system. More particularly, aspects of this disclosure relate to a fan module with a lever that is used to lock the fan module to the chassis and unlock the fan module from the chassis.

BACKGROUND

Fans modules are used in computing devices and systems to cool the device or system during use. Generally, one or more fan modules will be mounted in a chassis during use to stabilize the fan modules and provide strict placement within the computing device or system. The fan modules need to be locked into place within the chassis to prevent inadvertent movement during use. However, the fan modules must also be able to be easily removed from the chassis to be repaired or replaced. Components that allow the fan modules to be locked into place within the chassis, but also allow the fan modules to be easily unlocked for repair or replacement, are often bulky or unwieldy. However, utilizing space efficiently within the computing device or system is important, and these bulky or unwieldy components are often impractical.

SUMMARY

The various examples of the present disclosure are directed towards a fan module. In a first embodiment of the present disclosure, the fan module comprises a housing, a locking body, and a lever. The housing defines a hollow interior configured to house a fan. The locking body is coupled to the housing and is moveable between a locked position and an unlocked position. The lever is coupled to the housing and is moveable between a first position and a second position. Moving the lever from the first position to the second position causes the locking body to move from the locked position to the unlocked position.

In some examples of the first embodiment, the bottom end of the locking body is positioned below a lower edge of the housing when the locking body is in the locked position.

In some examples of the first embodiment, the bottom end of the locking body is positioned above a lower edge of the housing when the locking body is in the unlocked position.

In some examples of the first embodiment, the lever includes a proximal end and a distal end. The proximal end of the lever is pivotably coupled to the housing.

In some examples of the first embodiment, the proximal end of the lever contacts the locking body and moves the locking body from the locked position to the unlocked position as the lever moves from the first position to the second position.

In some examples of the first embodiment, the proximal lend of the lever has a curved tip, and the locking body has an outwardly-extending lip. The outwardly-extending lip of the locking body is configured to contact the curved tip of the proximal end of the lever.

In some examples of the first embodiment, the curved tip of the proximal end of the lever pivots as the lever pivots from the first position to the second position. When the curved tip pivots, the curved tip raises the outwardly-extending lip of the locking body such that the locking body moves from the locked position to the unlocked position.

In some examples of the first embodiment, the point of contact between (i) the curved tip of the proximal end of the lever and (ii) the outwardly-extending lip of the locking body moves upward in a generally vertical direction as the lever moves from the first position to the second position In some examples of the first embodiment, the locking body is biased toward the locked position.

In some examples of the first embodiment, the locking body is biased using (i) one or more springs, (ii) a flexible or compressible portion of the locking body, or (iii) both (i) and (ii).

In some examples of the first embodiment, the fan module further comprises a frame piece coupled to an end of the housing. The frame piece includes a top support, a first side support coupled to a first end of the top support, and a second side support coupled to a second end of the top support. The lever is pivotably mounted to the frame piece.

In some examples of the first embodiment, the lever includes a first arm, a second arm, and a handle. A proximal end of the first arm is pivotably mounted to the first side support of the frame piece. A proximal end of the second arm is pivotably mounted to the second side support of the frame piece. The handle is coupled to a distal end of the first arm and a distal end of the second arm.

In some examples of the first embodiment, the frame piece includes at least one upper surface formed by (i) a top end of the first side support, (ii) a top end of the second side support, or (iii) both (i) and (ii). The frame piece also includes a lateral surface formed by the top support. The lateral surface being positioned generally perpendicular to the at least one upper surface.

In some examples of the first embodiment, when the lever is in the first position, the handle of the lever is adjacent to (i) the at least one upper surface and (ii) the lateral surface. In the first position, the first arm and the second arm are generally parallel to the first side support and the second side support. When the lever is in the second position, the handle of the lever extends outward from the frame piece. In the second position, the first arm and the second arm are generally perpendicular to the first side support and the second side.

In some examples of the first embodiment, the lever further comprises a latch coupled to the handle. The latch is moveable between a resting position and a compressed position, and the latch is biased toward the resting position.

In some examples of the first embodiment, the frame piece includes one or more tabs projecting from the at least one upper surface of the frame piece. The latch of the lever is positioned between the lateral surface of the frame piece and the one or more tabs when the lever is in the first position and the latch is in the resting position. In this configuration, the lever is prevented from moving from the first position to the second position.

In some examples of the first embodiment, moving the latch from the resting position to the compressed position raises the latch above the one or more tabs. In this configuration, the lever is not prevented from moving from the first position to the second position.

In some examples of the first embodiment, the first side support includes an outwardly-extending lip, and the locking body includes an inwardly-extending lip. The inwardly-extending lip of the locking body resting upon the outwardly-extending lip of the first side support when the lever is in the first position.

In some examples of the first embodiment, moving the lever from the first position to the second position causes the lever to contact the locking body. The contact between the lever and the locking body causes the inwardly-extending lip of the locking body to be raised off of the outwardly-extending lip of the first side support.

In some examples of the first embodiment, the fan module is present in combination with a chassis. The chassis is configured to hold one or more fan modules. The fan module is mounted on a floor of the chassis. When the locking body is in the locked position, the locking body extends through a locking aperture defined in the floor of the chassis. Moving the lever from the first position to the second position raises the locking body out of the locking aperture to the unlocked position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 6 is a zoomed-in view of a lever and a locking body of the fan module of FIGS. 2A and 2B;

FIG. 8A is a side elevation view of the fan module of FIGS. 2A and 2B when the lever is between the first position and a second position;

FIG. 8B is a zoomed-in perspective view of the locking body of the fan module of FIGS. 2A and 2B when the lever is between the first position and the second position;

FIG. 9A is a side elevation view of the fan module of FIGS. 2A and 2B when the lever is in the second position; and FIG. 9B is a zoomed-in perspective view of the locking body of the fan module of FIGS. 2A and 2B when the lever is in the second position.

Figure 1:
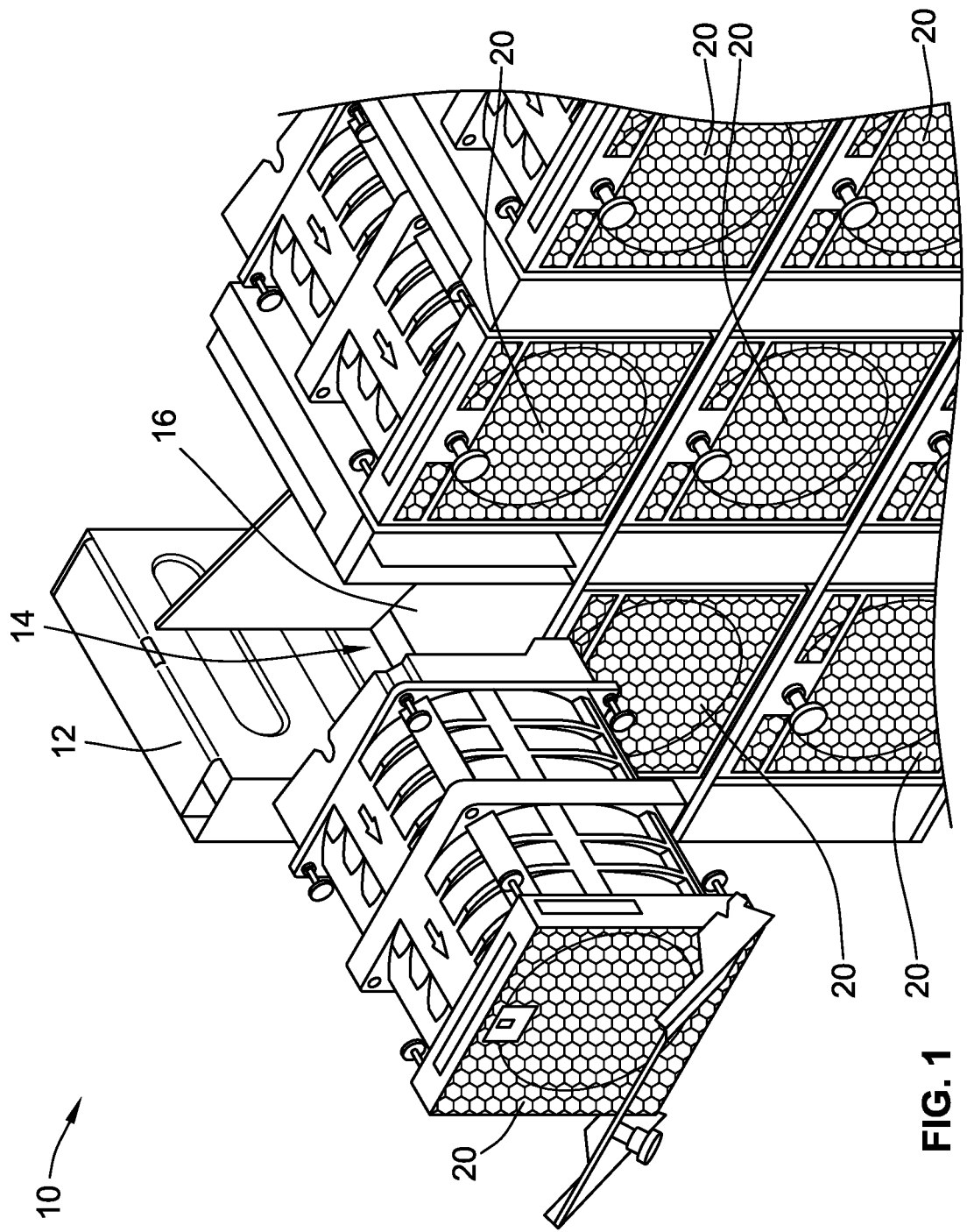
FIG. 1 is a fan wall including a plurality of fan modules mounted within a chassis.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 shows a fan wall 10 that includes a number of fan modules 20. The fan modules 20 are mounted within a chassis 12. Each fan module 20 is mounted within a respective socket 14 in the chassis 12. The fan modules 20 rest on the floor 16 of their respective sockets 14. Each fan module 20 contains at least one fan (not shown). The fan modules 20 mounted in the chassis 12 can be included as part of a computing device or system, such as a server. The components of the computing device or system are cooled by the fans during operation of the computing device or system. As is discussed in more detail below, the fan modules 20 can be locked to the chassis 12 to prevent unwanted movement during use.

Figure 2A:
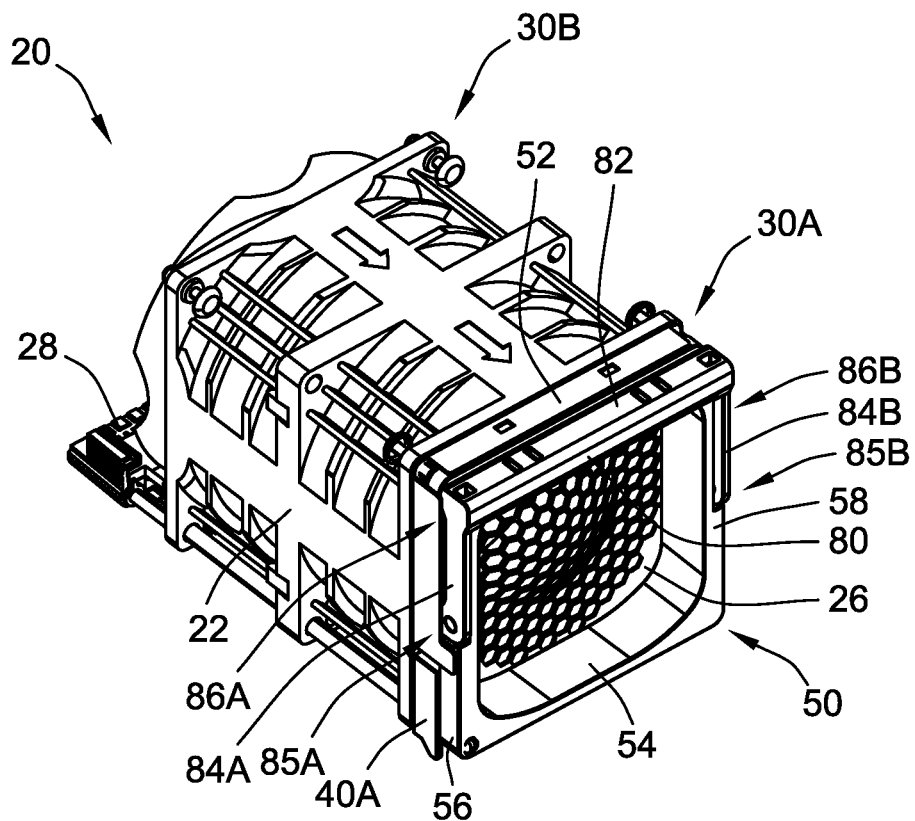
FIG. 2A is a perspective view of one of the fan modules of FIG. 1.
Figure 2B:
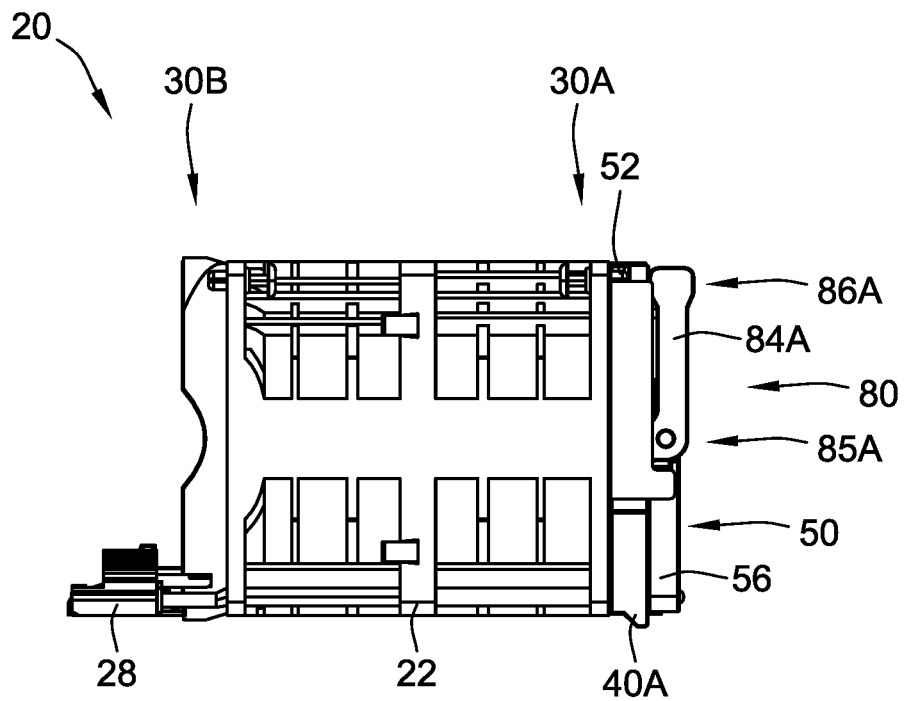
FIG. 2B is a side elevation view of the fan module of FIG. 2A.
Figure 3A:
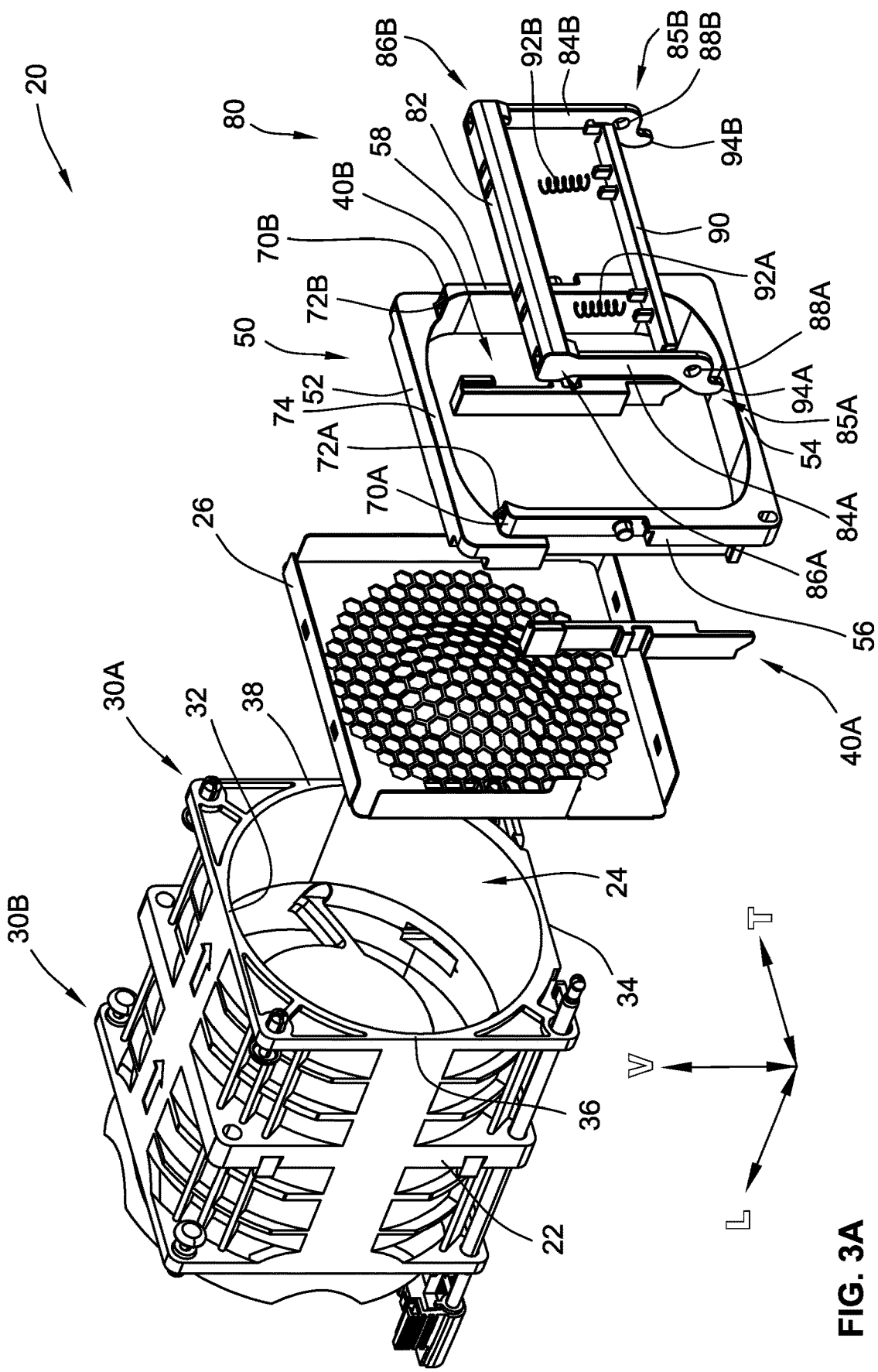
FIG. 3A is a first exploded perspective view of the fan module of FIGS. 2A and 2B.
Figure 3B:
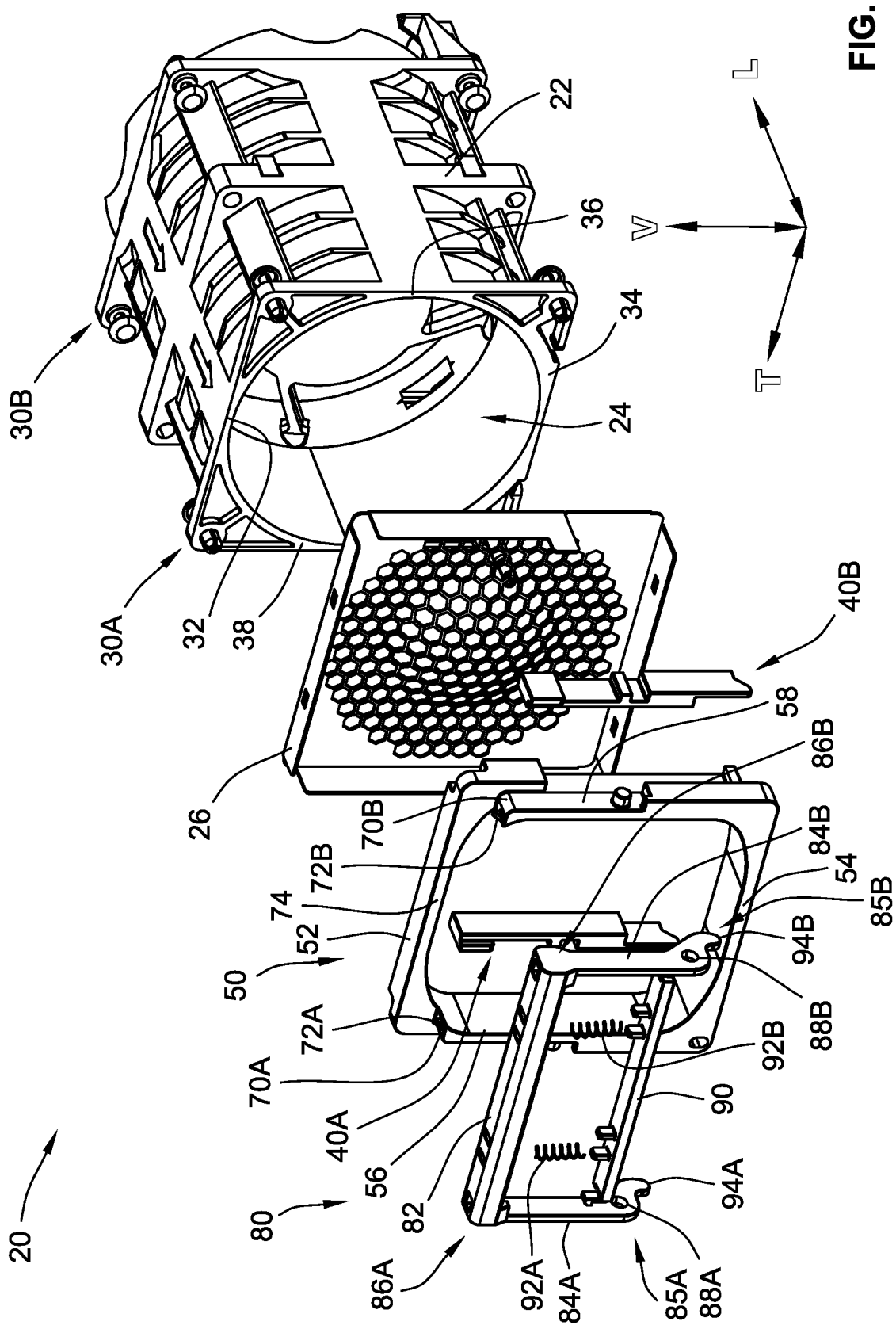
FIG. 3B is a second exploded perspective view of the fan module of FIGS. 2A and 2B.

FIGS. 2A and 2B show an individual fan module 20. FIG. 2A shows a perspective view of the fan module 20, and FIG. 2B shows a side elevation view of the fan module 20. The fan module 20 generally includes a housing 22 that defines a hollow interior 24 (FIGS. 3A and 3B). An individual fan (not shown) is positioned within the hollow interior 24 of the housing 22. A fan shield 26 is coupled to a first end 30A of the housing 22. The fan shield 26 protects the fan mounted within the housing 22, and prevents users (or other foreign objects) from inadvertently contacting the fan during use. A fan connector 28 can be coupled to an opposing second end 30B of the housing 22. The fan connector 28 electronically connects the fan to other components within the computing device or system. These other components can be used to control the fan during operation of the computing device or system.

The fan module 20 further includes a first locking body 40A that is used to lock the fan module 20 to the chassis 12 or to the floor 16 of the chassis 12 (FIG. 1). The fan module also has a second locking body that is shown in FIGS. 3A and 3B. In order to repair or replace the fan module 20, a lever 80 is coupled to the housing 22. The lever 80 is used to move the first locking body 40A between a locked position and an unlocked position. When the first locking body 40A is moved to the unlocked position, the fan module 20 can be removed from the chassis 12.

The fan module 20 further includes a frame piece 50 that is coupled to the housing 22. In the implementation illustrated in FIGS. 2A and 2B, the frame piece 50 is coupled directly to the housing 22. The first locking body 40A is positioned between the housing 22 and the frame piece 50, and the lever 80 is pivotably mounted to the frame piece 50. As will be explained in more detail below, the lever 80 can be pivoted between a first position (shown in FIGS. 2A, 2B, and 7A) and a second position (shown in FIG. 9A) in order to raise the first locking body 40A from the locked position (shown in FIGS. 2A, 2B, 7A, and 7B) to the unlocked position (shown in FIGS. 9A and 9B).

The frame piece 50 is formed from a top support 52, a bottom support 54, a first side support 56, and a second side support 58. The first side support 56 connects one end of the top support 52 and the bottom support 54. Similarly, the second side support 58 connects the opposite end of the top support 52 and the bottom support 54. In the implementation illustrated in FIGS. 2A and 2B, the frame piece 50 has a generally square cross-section. The first end 30A of the housing 22 also has a generally square cross-section. In other implementations, the frame piece 50 and the housing 22 may have other types or shapes of cross-sections.

The lever 80 is formed from a handle 82 connected to a first arm 84A and a second arm 84B. A proximal end 85A of the first arm 84A is coupled to the first side support 56 of the frame piece 50. A proximal end 85B of the second arm 84B is coupled to the second side support 58 of the frame piece 50. A distal end 86A of the first arm 84A is connected to one end of the handle 82. A distal end 86B of the second arm 84B is connected to the other end of the handle 82.

FIGS. 3A and 3B show exploded views of the fan module 20 of FIGS. 2A and 2B. The exploded components include the fan shield 26; the locking bodies 40A and 40B; the frame piece 50 (formed from the top support 52, the bottom support 54, the first side support 56, and the second side support 58); and the lever 80. FIGS. 3A and 3B define three axes that are used herein to describe the various components of the fan module 20. The longitudinal axis L is the axis upon which the housing 22, the fan shield 26, the locking bodies 40A, 40B, the frame piece 50, and the lever 80 are all aligned. The fan is inserted into and removed from the housing 22 along the longitudinal axis L. The fan module 20 can be inserted into and removed from the chassis 12 along the longitudinal axis L.

A vertical axis V is generally perpendicular to the longitudinal axis L. The vertical axis V connects a top edge 32 and a bottom edge 34 of the first end 30A of the housing 22. A transverse axis T is generally perpendicular to both the longitudinal axis L and the vertical axis T. The transverse axis T generally connects a first side edge 36 and a second side edge 38 of the first end 30A of the housing 22. These axes L, V, and T are also shown in FIGS. 4A-5B.

As can be seen FIGS. 3A and 3B, the top support 52 forms a longitudinally-facing surface 74 that faces away from the housing 22. The upper portion of the first side support 56 of the frame piece 50 forms a first upper surface 70A that faces perpendicular to the longitudinally-facing surface 74. The upper portion of the second side support 58 forms a second upper surface 70B that also faces perpendicular to the longitudinally-facing surface 74. A first retention tab 72A extends upward from the first upper surface 70A, while a second retention tab 72B extends upward from the second upper surface As shown, the fan module 20 includes a first locking body 40A and a second locking body 40B that are positioned on either side of the housing 22. The first locking body 40A is positioned between the first side edge 36 of the housing 22, and the first side support 56 of the frame piece 50. The second locking body 40B is positioned between the second side edge 38 of the housing 22, and the second side support 58 of the frame piece 50. When the fan module 20 is assembled (shown in FIGS. 2A and 2B), the first locking body 40A will generally be held in place by the first side edge 36 of the housing 22, and the first side support 56 of the frame piece 50. Similarly, the second locking body 40B will generally be held in place by the second side edge 38 of the housing 22, and the second side support 58 of the frame piece 50.

Figure 4B:
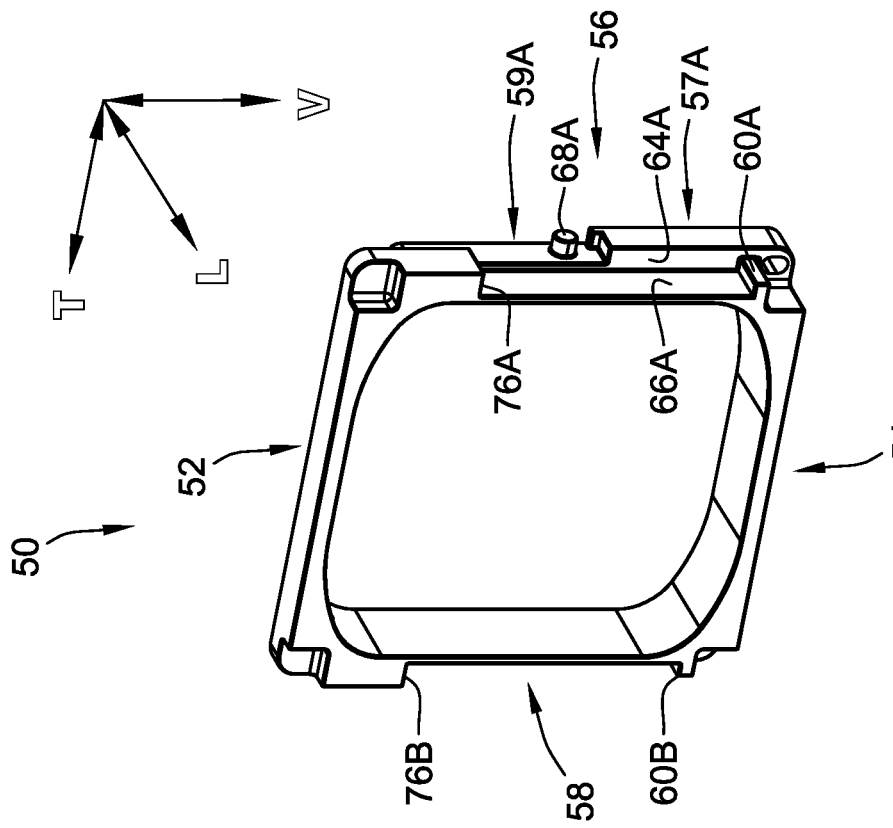
FIG. 4B is a second perspective view of the first side of the frame piece of FIG. 4A.
Figure 4A:
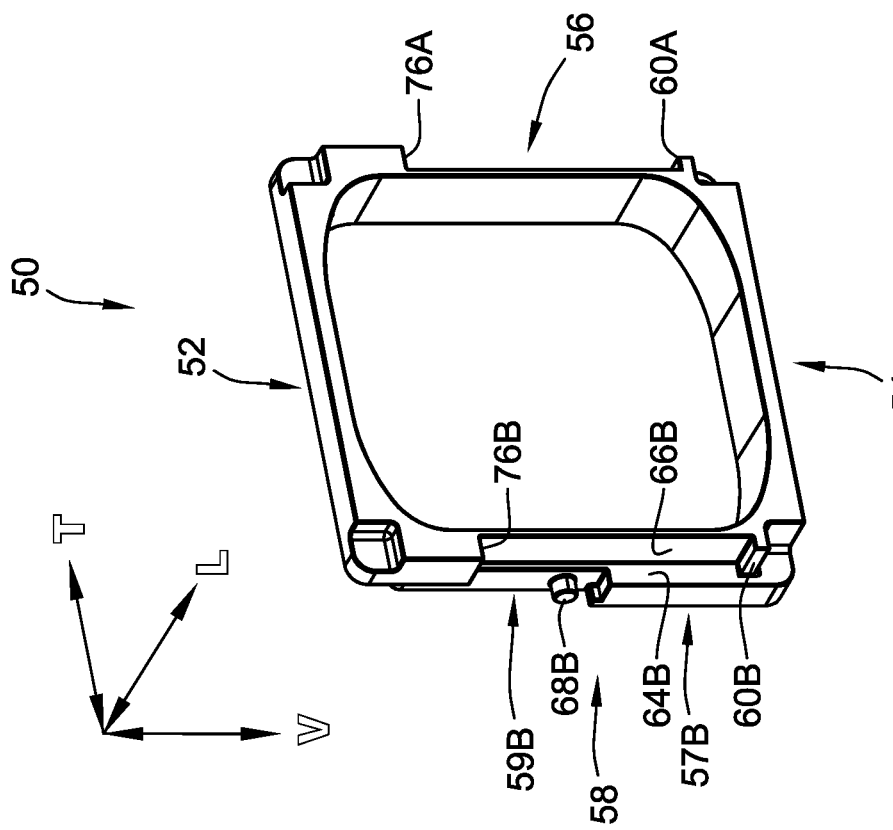
FIG. 4A is a first perspective view of a first side of a frame piece of the fan module of FIGS. 2A and 2B.
Figures 4C, 4D:
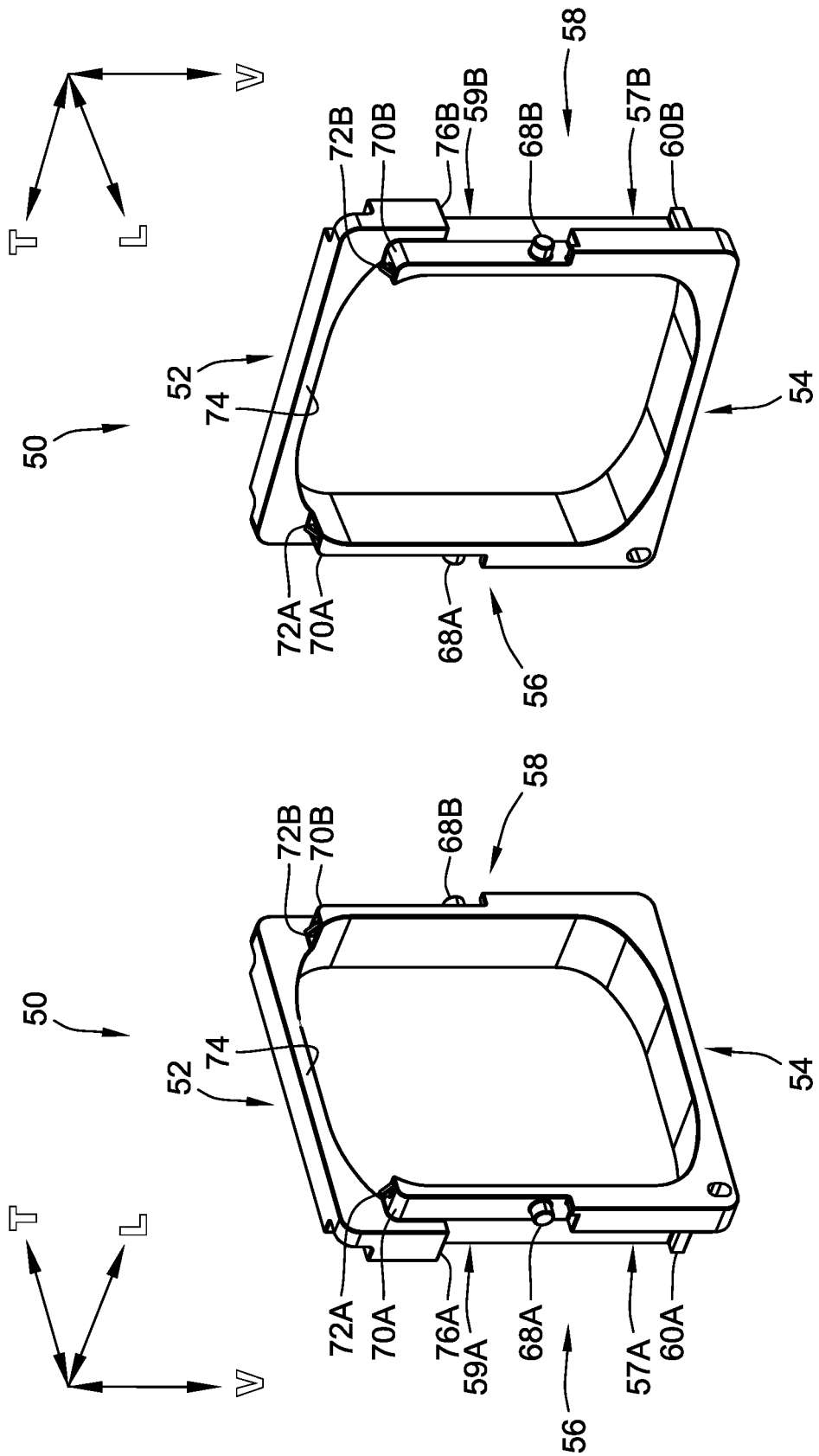
FIG. 4C is a first perspective view of a second side of the frame piece of FIG. 4A.
FIG. 4D is a second perspective view of the second side of the frame piece of FIG. 4A.

FIGS. 4A and 4B show perspective views of a side of the frame piece 50 that faces toward the housing 22 (FIGS. 3A and 3B). FIGS. 4C and 4D show a perspective view of the opposite side of the frame piece 50 that faces away from the housing 22 (FIGS. 3A and 3B). The first side support 56 of the frame piece 50 includes a first outwardly-extending lip 60A, and a second outwardly-extending lip 76A. The outwardly-extending lips 60A and 76A extend along the transverse axis T in a first transverse direction, away from both the first side support 56 and the second side support 58. The second side support 58 similarly includes a first outwardly-extending lip 60B and a second outwardly extending lip 76B. The outwardly-extending lips 60B and 76B extend along the transverse axis T in a second transverse direction, away from both the first side support 56 and the second side support 58. The second transverse direction is generally parallel to and opposed to the first transverse direction.

The first side support 56 of the frame piece 50 has a lower portion 57A and an upper portion 59A. The lower portion 57A is generally wider along the transverse axis T than the upper portion 59A. The lower portion 57A thus forms a longitudinally-facing surface 64A, and a transversely-facing surface 66A, that face perpendicular to each other. Similarly, the second side support 58 of the frame piece 50 has a lower portion 57B and an upper portion 59B. The lower portion 57B is wider along the transverse axis T than the upper portion 59B. The lower portion 57B thus forms a longitudinally-facing surface 64B, and a transversely-facing surface 66B, that face perpendicular to each other.

The first and second side supports 56, 58 have mounting bosses that aid in pivotably mounting the lever 80 to the frame piece 50. A first mounting boss 68A extends outward from the first side support 56 in the first transverse direction. A second mounting boss 68B extends outward from the second side support 58 in the second transverse direction.

The longitudinal dimension of the top support 52 is generally smaller than the longitudinal dimension of the upper portion 59A of the first side support 56. The upper portion 59A thus forms the first upper surface 70A. Similarly, the longitudinal dimension of the top support 52 is generally smaller than the longitudinal dimension of the upper portion 59B of the second side support 58. The upper portion 59B thus forms the second upper surface 70B.

A first retention tab 72A extends upward along the vertical axis V from the first upper surface 70A. A second retention tab 72B extends upward along the vertical axis V from the second upper surface 70B. The top support 52 extends along the vertical axis V above the upper surfaces 70A, 70B of the first and second side supports 56, 58. The top support 52 thus forms a longitudinally-facing or lateral surface 74 that is generally perpendicular to the first and second upper surfaces 70A, 70B.

Figure 5A:
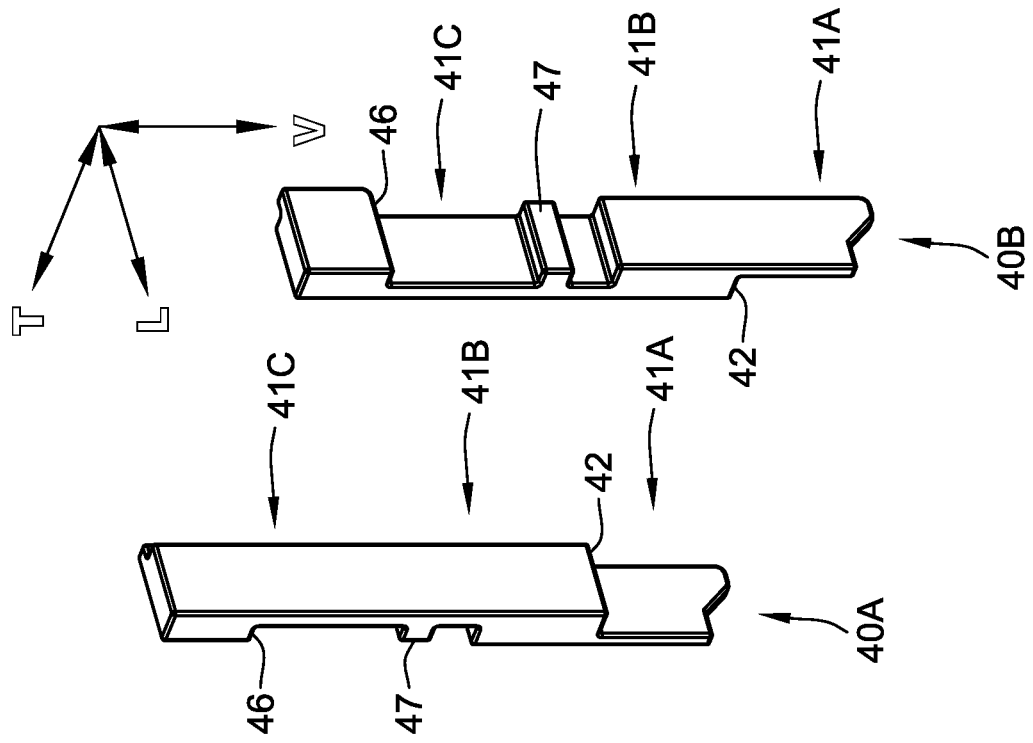
FIG. 5A is a first perspective view of a pair of locking bodies of the fan module of FIGS. 2A and 2B.
Figure 5B:
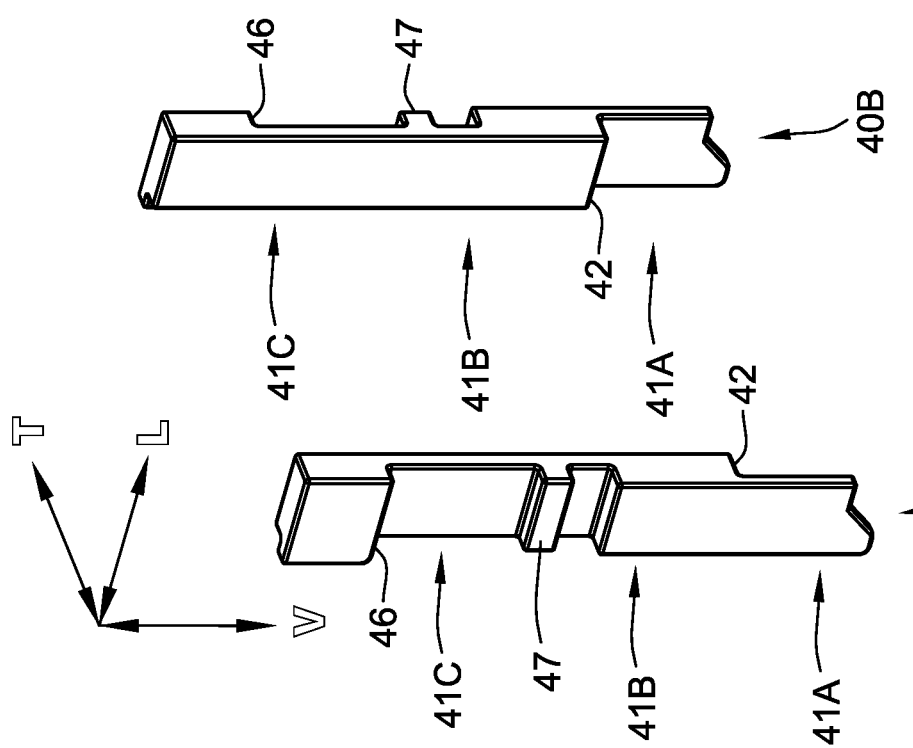
FIG. 5B is a second perspective view of the pair of locking bodies of FIG. 5A.

FIGS. 5A and 5B show perspective view of the locking body 40A and the locking body 40B. The locking bodies 40A, 40B have a bottom portion 41A, a top portion 41C, and a thicker middle portion 41B. The bottom and top portions 41A, 41C are offset from their respective middle portions 41B in opposing directions. The bottom portion 41A of each locking body 40A, 40B is offset from the middle portion 41B in a direction away from the frame piece 50 (FIGS. 3A and 3B). The top portion 41C of each locking body 40A, 40B is offset from the middle portion 41B in a direction towards the frame piece 50.

Thus, the bottom portion 41A of the first locking body 40A is offset from the middle portion 41B in the first transverse direction along the transverse axis T. The top portion 41C of first locking body 40A is offset from the middle portion 41B in the second transverse direction along the transverse axis T. The bottom portion 41A of the second locking body 40B is offset from the middle portion 41B in the second transverse direction along the transverse axis T. The top portion 41C of the second locking body 40B is offset from the middle portion 41B in the first transverse direction along the transverse axis T.

The bottom portion 41A and the middle portion 41B of first locking body 40A form an inwardly-extending (e.g., towards the frame piece 50) lip 42. The bottom portion 41A and the middle portion 41B of the second locking body 40B also form an inwardly-extending lip 42. When the fan module 20 is assembled, the inwardly-extending lip 42 of the first locking body 40A rests on the outwardly-extending lip 60A of the first side support 56. The inwardly-extending lip 42 of the second locking body 40B rests on the outwardly-extending lip 60B of the second side support 58.

Both of the locking bodies 40A, 40B also have an outwardly-extending lip 46. The outwardly-extending lip 46 extends from the top portions 41C of the locking bodies 40A, 40B along the transverse axis T, away from the frame piece 50. As is explained in more detail below, a curved tip 94A of the first arm 84A of the lever 80 contacts the outwardly-extending lip 46 of the first locking body 40A to move the first locking body 40A from the locked position to the unlocked position (shown in FIG. 6). Similarly, a curved tip 94B of the second arm 84B of the lever 80 contacts the outwardly-extending lip 46 of the second locking body 40B to move the second locking body 40B from the locked position to the unlocked position.

Referring to FIGS. 4A-5B, when the fan module 20 is assembled (FIGS. 2A and 2B), the first locking body 40A is positioned between (i) the first side edge 36 of the first end 30A of the housing 22, (ii) the longitudinally-facing surface 64A of the first side support 56, (iii) the transversely-facing surface 66A of the first side support 56, and (iv) the outwardly-extending lip 60A of the first side support 56. When the fan module 20 is assembled, the second locking body 40B is positioned between (i) the second side edge 38 of first end 30A of the housing 22, (ii) the longitudinally-facing surface 64B of the second side support 58, (iii) the transversely-facing surface 66B of the second side support 58, and (iv) the outwardly-extending lip 60B of the second side support 58.

In some implementations, the locking body 40A contacts the second outwardly-extending lip 76A when the locking body 40A is raised to the unlocked position. Similarly, in some implementations, the locking body 40B contacts the second outwardly-extending lip 76B when the locking body 40B is raised to the unlocked position. Thus, the outwardly-extending lips 76A, 76B can prevent the lever 80 from being pivoted too far past the second position (shown in FIG. 9A).

Referring back to FIGS. 3A and 3B, the proximal end 85A of the first arm 84A has a corresponding first mounting aperture 88A. The proximal end 85B of the second arm 84B has a corresponding second mounting aperture 88B. When the lever 80 is mounted to the frame piece 50, the proximal end 85A of the first arm 84A is placed over the first side support 56, so that the first mounting boss 68A extends through the first mounting aperture 88A. Similarly, the proximal end 85B of the second arm 84B is placed over the second side support 58, so that the second mounting boss 68B extends through the second mounting aperture 88B. The first and second arms 84A, 84B of the lever 80 are thus pivotably mounted to the first and second side supports 56, 58, respectively, using the first and second mounting bosses 68A, 68B.

In some implementations, the first mounting boss 68A is coupled to the proximal end 85A of the first arm 84A with an interference fit. Similarly, the second mounting boss 68B can be coupled to the proximal end 85B of the second arm 84B with an interference fit. In these implementations, friction between the first mounting boss 68A and the periphery of the mounting aperture 88A secures the first arm 84A to the frame piece 50. Similarly, friction between the second mounting boss 68B and the periphery of the mounting aperture 88B secures the second arm 84B to the frame piece 50. The friction between these components is large enough to prevent the first and second arms 84A, 84B from inadvertently slipping off of their respective mounting bosses 68A, 68B. The friction between these components is also small enough to allow the arms 84A, 84B (and thus the lever 80) to pivot with respect to the frame piece 50.

In other implementations, the outer ends of the mounting bosses 68A, 68B have a diameter that is slightly larger than a diameter of the mounting apertures 88A, 88B. The remaining portions of the mounting bosses 68A, 68B have a diameter that is slightly less than the diameter of the mounting apertures 88A, 88B. Additionally, the mounting bosses 68A, 68B are formed from a generally compressible material. The proximal ends 85A, 85B of the first and second arms 84A, 84B can be snapped over the mounting bosses 68A, 68B to secure the lever 80 to the frame piece 50. The force applied to the outer ends of the mounting bosses 68A, 68B causes the outer ends to compress slightly. The outer ends of the mounting bosses 68A, 68B can thus pass through the mounting apertures 88A, 88B. The larger diameter of the outer ends of the mounting bosses 68A, 68B then secures the first and second arms 84A, 84B to the frame piece 50.

When the lever 80 is in the first position (shown in FIGS. 2A, 2B, and 7A), the first and second arms 84A, 84B extend upward along the vertical axis V and are generally parallel to the first and second side supports 56, 58 of the frame piece 50. In the first position, the handle 82 of the lever 80 is positioned adjacent to and in close proximity with the longitudinally-facing surface 74 of the top support 52, and to the first and second upper surfaces 70A, 70B of the first and second side supports 56, 58.

The lever 80 includes a latch 90 that is used to passively maintain the lever 80 in the first position. The latch 90 is coupled to an underside of the handle 82 via springs 92A, 92B. The springs 92A, 92B bias the latch 90 downward towards a resting position. A user can compress the springs 92A, 92B by squeezing the latch 90 and the handle 82. The latch 90 is thus caused to move upwards along the vertical axis V to a compressed position.

When the fan module 20 is locked to the chassis 12, the lever 80 is in the first position adjacent to the top support 52 of the frame piece 50, and the latch 90 is in the resting position. When the latch 90 is in the resting position, the latch 90 is positioned adjacent to the first and second upper surfaces 70A, 70B of the first and second side supports 56, 58. The portion of the latch 90 near the first arm 84A is positioned between (i) the portion of the longitudinally-facing surface 74 of the top support 52 that is near the first side support 56, and (ii) the first retention tab 72A.

Similarly, the portion of the latch 90 near the second arm 84B is positioned between (i) the portion of the longitudinally-facing surface 74 of the top support 52 that is near the second side support 58, and (ii) the second retention tab 72B. The latch 90 is thus locked into place by (i) the longitudinally-facing surface 74 of the top support 52 and (ii) the first retention tab 72A and the second retention tab 72B. Because the latch 90 is coupled to the handle 82 of the lever 80, the lever 80 is also locked into place, and cannot be moved away from the first position toward the second position (shown in FIG. 9A). The latch 90 thus prevents the fan module 20 from being inadvertently unlocked from the chassis 12 during use.

In other implementations, the latch 90 is not positioned entirely between the retention tabs 72A, 72B and the longitudinally-facing surface 74. Rather, the underside of the latch 90 may have apertures (not shown) into which the retention tabs 72A, 72B fit when the lever is in the first position and the latch 90 is uncompressed. Thus, a portion of the latch 90 will be positioned on one side of the retention tabs 72A, 72B (directly adjacent to the longitudinally-facing surface 74). Another portion of the latch 90 is positioned on the opposite side of the retention tabs 72A, 72B, opposite the longitudinally-facing surface 74.

To unlock the lever 80, the latch 90 and the handle 82 are squeezed so that the springs 92A, 92B compress, moving the latch 90 to a compressed position. In the compressed position, the latch 90 is positioned above the first retention tab 72A and the second retention tab 72B, along the vertical axis V. The latch 90 is thus no longer locked into place between (i) the longitudinally-facing surface 74 of the top support 52 and (ii) the first retention tab 72A and the second retention tab 72B. The lever 80 is no longer prevented from pivoting from the first position to the second position. In the second position, the first and second arms 84A, 84B extend along the longitudinal axis L and are generally perpendicular to the first and second side supports 56, 58. The handle 82 of the lever 80 is positioned away from the frame piece 50 along the longitudinal axis L.

In the illustrated implementation, the latch 90 is generally the same length as the top support 52 and/or the handle 82. The latch 90 thus spans the entire transverse distance between (i) the first upper surface 70A of the first side support 56, and (ii) the second upper surface 70B of the second side support 58. Other implementations are also possible however. In one implementation, the frame piece 50 has only one of the retention tabs 72A, 72B. The latch 90 thus does not need to be the same length as the top support 52 and/or the handle 82. Instead, the latch 90 can be located underneath the handle 82 near only one of the first arm 84A and the second arm 84B. When in the compressed position, the latch 90 is positioned between the longitudinally-facing surface 74 of the top support 52 and either the first retention tab 72A or the second retention tab 72B. In other implementations, the retention tab is positioned generally near the center of the top support 52, and the latch 90 is positioned generally near the center of the handle 82. The latch 90 can also be the same length as the handle 82, regardless of where the retention tabs are located.

The locking components of the fan module 20—the frame piece 50; the first and second locking bodies 40A, 40B; the lever 80; and the handle 82—occupy a small amount of space beyond the first end 30A of the housing 22 when in use. The longitudinal dimensions of both the top support 52 and the handle 82 are generally less than the longitudinal dimension of the upper portion 59A of the first side support 56, and the longitudinal dimension of the upper portion 59B of the second side support 58. The lever 80 can thus be positioned in close proximity to the top support 52 when the lever 80 is in the first position.

The lever 80 does not extend along the longitudinal axis any further than the frame piece 50 itself, thus reducing the amount of space that the locking components of the fan module 20 occupy. In some implementations, the locking components of the fan module 20 extend beyond the first end 30A of the housing 22 a maximum distance of about 20.0 mm, about 19.0 mm, between about 19.0 mm and about 20.00 mm, or between about 15.0 mm and about 20.0 mm.

FIG. 6 shows the interaction between (i) the proximal end 85A of the first arm 84A of the lever 80 and (ii) the first locking body 40A as the lever 80 is moved from the first position to the second position. While FIG. 4 shows only the first arm 84A and the first locking body 40A, the interaction between the proximal end 85B of the second arm 84B and the second locking body 40B (FIGS. 3A and 3B) is generally the same.

As shown, the proximal end 85A of the first arm 84A terminates in the generally curved tip 94A. The curved tip 94A contacts the underside of the outwardly-extending lip 46 of the first locking body 40A. As the lever 80 is pivoted from the first position to the second position, the proximal end 85A of the first arm 84A pivots about the first mounting boss 68A. The curved tip 94A moves upward along the vertical axis V, and away from the housing 22 along the longitudinal axis L.

As the curved tip 94A moves upwardly and outwardly, it pushes upward against the outwardly-extending lip 46 of the first locking body 40A. The curved tip 94A thus lifts the first locking body 40A along the vertical axis V, and moves the first locking body 40A from the locked position to the unlocked position. The curved tip 94A of the proximal end 85A of the first arm 84A thus acts as a cam that converts the pivoting movement of the lever 80 to linear movement of the first locking body 40A.

FIGS. 7A-9B show the position of the lever 80 and the first locking body 40A relative to the housing 22 as the lever 80 moves from the first position to the second position, and thus as the locking body 40A moves from the locked position to the unlocked position. Similar to FIG. 6, FIGS. 7A-9B only show the first locking body 40A and the first arm 84A of the lever 80. However, the description of these components generally applies to the second locking body 40B and the second arm 84B (FIGS. 3A and 3B) of the lever 80 as well.

Figure 7B:
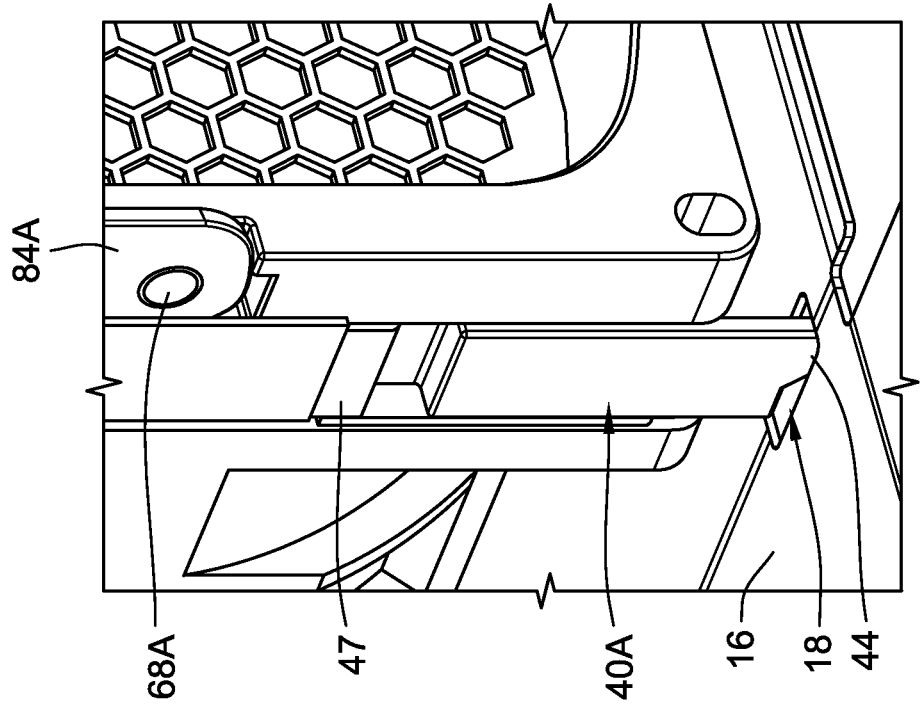
FIG. 7B is a zoomed-in perspective view of the locking body of the fan module of FIGS. 2A and 2B when the lever is in the first position.
Figure 7A:
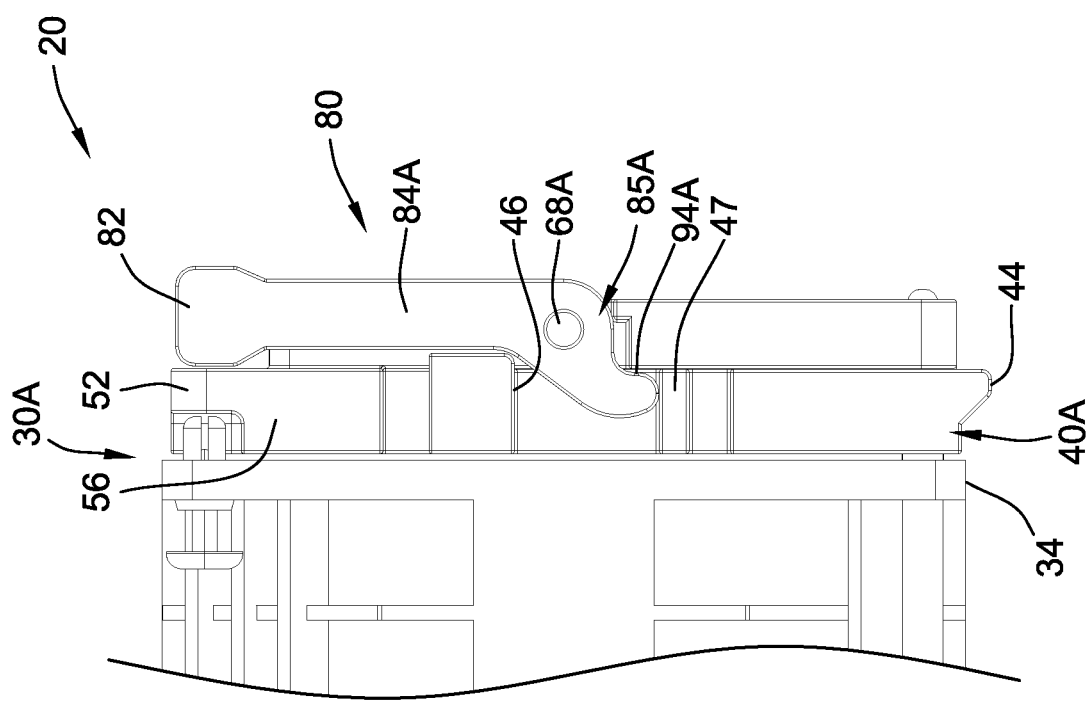
FIG. 7A is a side elevation view of the fan module of FIGS. 2A and 2B when the lever is in a first position.

In FIGS. 7A and 7B, the lever 80 is in the first position. In the first position, the handle 82 is positioned adjacent to the top support 52 of the frame piece 50. The handle 82 is also positioned adjacent to (i) the upper surfaces 70A, 70B of the first and second side supports 56, 58 (FIGS. 2A and 2B), and (ii) the first and second retention tabs 72A, 72B (FIGS. 3A and 3B). When the lever 80 is in the first position, the curved tip 94A points generally downward away from the outwardly-extending lip 46 of the first locking body 40A.

The curved tip 94A thus does not contact the outwardly-extending lip 46, and the first locking body 40A is in the locked position.

In the locked position, a bottom end 44 of the locking body 40A is positioned below the bottom edge 34 of the first end 30A of the housing 22. In the locked position, the bottom end 44 of the locking body 40A is also positioned below any other component or portion of the fan module 20 as well. When the fan module 20 is resting on the floor 16 of the chassis, the bottom end 44 of the locking body 40A extends through a locking aperture 18 defined in the floor 16 of the chassis 12, as shown in FIG. 7B. The fan module 20 is thus locked into place and prevented from inadvertently moving within the chassis 12.

In FIGS. 8A and 8B, the lever 80 has pivoted away from the first position into an intermediate position between the first position and the second position. Here, the first arm 84A of the lever 80 is not parallel with the first side support 56, nor is the first arm 84A of the lever 80 perpendicular to the first side support 56. Because the lever 80 has begun to pivot away from the first position, the curved tip 94A of the proximal end 85A of the first arm 84A has begun to pivot upwards. The curved tip 94A begins to contact the outwardly-extending lip 46 of the first locking body 40A. The curved tip 94A thus has begun to move the locking body 40A from the locked position. As shown in FIG. 8A, the bottom end 44 of the locking body 40A has not yet risen above the bottom edge 34 of the housing 22. As shown in FIG. 8B, when the lever 80 is moved to the intermediate position, the bottom end 44 of the locking body 40A has not yet risen out of the locking aperture 18 defined in the floor 16.

In FIGS. 9A and 9B, the lever 80 has pivoted all the way to the second position. In the second position, the first arm 84A of the lever 80 is generally perpendicular to the first side support 56. The distal end 86A of the first arm 84A and the handle 82 are positioned away from the frame piece 50 along the longitudinal axis. As the lever 80 pivots to the second position, the curved tip 94A of the proximal end 85A of the first arm 84A continues to pivot upwards. As the curved tip 94A presses against the outwardly-extending lip 46 of the first locking body 40A, the first locking body 40A is raised to the unlocked position. As shown in FIG. 9A, the bottom end 44 of the first locking body 40A is positioned above the bottom edge 34 of the housing 22. FIG. 9B shows that when the fan module 20 is mounted in the chassis 12 and the first locking body 40A is moved to the unlocked position, the bottom end 44 of the first locking body 40A does not extend into the locking aperture 18 of the floor 16 of the chassis 12. Thus, when the lever 80 moves to the second position to cause the locking body 40A to move to the unlocked position, the fan module 20 can safely be removed from the chassis 12.

As can be seen in FIGS. 7A, 8A, and 9A, the amount that the first locking body 40A is moved upwards depends on the dimension of the first arm 84A between the first mounting aperture 88A and the outwardly-extending lip 46 of the first locking body 40A. Because the curved tip 94A of the first arm 84A curves down and away from the mounting aperture 88A, this dimension slowly increases as the lever 80 is pivoted to the second position and the curved tip 94A pivots upward. In FIG. 7A, the dimension of the first arm 84A between the first mounting aperture 88A and the outwardly-extending lip 46 of the first locking body 40A is minimized. The locking body 40A is thus settled into the locked position.

In FIG. 8A, the curved tip 94A has begun to pivot upwards. Here, the dimension of the first arm 84A between the first mounting aperture 88A and the outwardly-extending lip 46 of the first locking body 40A has increased due to the curve of the tip. Thus, the locking body 40A is initially raised from the locked position. Finally, in FIG. 9A, the dimension of the first arm 84A between the first mounting aperture 88A and the outwardly-extending lip 46 of the first locking body 40A is at a maximum. The lever 80 has pivoted all the way to the second position, and thus the curved tip 94A has pivoted upwards enough that it is generally positioned between the first mounting aperture 88A and the outwardly-extending lip 46 of the first locking body 40A. The curved tip 94A has thus caused the locking body 40A to be completely raised to the unlocked position. As can be seen by comparing FIGS. 7A, 8A, and 9A, the point of contact between the proximal end 85A of the first arm 84A and the outwardly-extending lip 46 of the first locking body 40A moves upward in a generally vertical direction as the lever 80 moves from the first position to the second position.

In some implementations, the first and second locking bodies 40A, 40B may be biased towards the locked position. In one implementation, one or more springs are positioned so as to compress as the first and second locking bodies 40A, 40B are moved upward to the locked position. In this implementation, the springs expand once the force moving the lever 80 to the second position is removed, automatically returning the first and second locking bodies 40A, 40B to their locked position. In another implementation, the first and second locking bodies 40A, 40B are made of a material that is generally compressible. As the first and second locking bodies 40A, 40B are moved to the unlocked position, they each compress as they are pressed against the outwardly-extending lips 76A, 76B of the first and second side supports 56, 58. Then, once the force moving the lever 80 to the second position is removed, the first and second locking bodies 40A, 40B expand and begin return to their unlocked positions.

In other implementations, the locking bodies 40A, 40B remain in the unlocked position once they are moved upward. To move the locking bodies 40A, 40B back to the locked position, the lever 80 is moved back to the first position. As the lever is moved to the first position, the curved tips 94A, 94B can contact a second outwardly-extending lip 47 (FIGS. 5A and 5B) of the locking bodies 40A, 40B to force the locking bodies 40A, 40B back to the locked position.

As used herein, "coupled" can mean both directly coupled or indirectly coupled. For example, in the illustrated implementation, the lever 80 is coupled to the housing 22 by mounting the lever 80 to the frame piece 50, and attaching the frame piece 50 to the housing 22 and/or the fan shield 26. In other implementations, the lever 80 is coupled to the housing 22 by pivotally mounting the lever 80 directly to the housing 22. In this implementation, the housing 22 can be shaped to include various features from the frame piece 50, such as the outwardly-extending lips 60A, 60B and the mounting bosses 68A, 68B.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A fan module comprising:
   a housing defining a hollow interior configured to house a fan;
   a locking body coupled to the housing and moveable between a locked position and an unlocked position; and
   a lever coupled to the housing and moveable between a first position and a second position,
   wherein movement of the lever from the first position to the second position causes the locking body to move from the locked position to the unlocked position,
   wherein when the locking body is in the locked position, a bottom end of the locking body is positioned below a lower edge of the housing, and
   wherein when the locking body is in the unlocked position, the bottom end of the locking body is positioned above the lower edge of the housing.

2. The fan module of claim 1, wherein the lever includes a proximal end and a distal end, and wherein the proximal end of the lever is pivotably coupled to the housing.

3. The fan module of claim 2, wherein the proximal end of the lever contacts the locking body and moves the locking body from the locked position to the unlocked position as the lever moves from the first position to the second position.

4. The fan module of claim 3, wherein the proximal end of the lever has a curved tip, and wherein the locking body has an outwardly-extending lip configured to contact the curved tip of the proximal end of the lever.

5. The fan module of claim 4, wherein the curved tip of the proximal end of the lever pivots as the lever pivots from the first position to the second position, the pivoting of the curved tip raising the outwardly-extending lip of the locking body such that the locking body moves from the locked position to the unlocked position.

6. The fan module of claim 5, wherein a point of contact between (i) the curved tip of the proximal end of the lever and (ii) the outwardly-extending lip of the locking body moves upward in a generally vertical direction as the lever moves from the first position to the second position.

7. The fan module of claim 1, wherein the locking body is biased toward the locked position.

8. The fan module of claim 7, wherein the locking body is biased using (i) one or more springs, (ii) a flexible or compressible portion of the locking body, or (iii) both (i) and (ii).

9. The fan module of claim 1, further comprising a frame piece coupled to an end of the housing, the frame piece including at least a top support, a first side support coupled to a first end of the top support, and a second side support coupled to a second end of the top support, the lever being pivotably mounted to the frame piece.

10. The fan module of claim 9, wherein the lever includes a first arm, a second arm, and a handle, a proximal end of the first arm being pivotably mounted to the first side support of the frame piece, a proximal end of the second arm being pivotably mounted to the second side support of the frame piece, the handle being coupled to a distal end of the first arm and a distal end of the second arm.

11. The fan module of claim 10, wherein the frame piece includes at least one upper surface formed by (i) a top end of the first side support, (ii) a top end of the second side support, or (iii) both (i) and (ii), and wherein the frame piece includes a lateral surface formed by the top support, the lateral surface being positioned generally perpendicular to the at least one upper surface.

12. The fan module of claim 11,
   wherein the handle of the lever is positioned adjacent to (i) the at least one upper surface and (ii) the lateral surface when the lever is in the first position, such that the first arm and the second arm are generally parallel to the first side support and the second side support,
   and wherein the handle of the lever extends outward from the frame piece when the lever is in the second position, such that the first arm and the second arm are generally perpendicular to the first side support and the second side.

13. The fan module of claim 11, wherein the lever further comprises a latch coupled to the handle and moveable between a resting position and a compressed position, the latch being biased toward the resting position.

14. The fan module of claim 13, wherein the frame piece includes one or more tabs projecting from the at least one upper surface of the frame piece, the latch of the lever being positioned between the lateral surface of the frame piece and the one or more tabs when the lever is in the first position and the latch is in the resting position, such that the lever is prevented from moving from the first position to the second position.

15. The fan module of claim 14, wherein moving the latch from the resting position to the compressed position raises the latch above the one or more tabs, such that the lever is not prevented from moving from the first position to the second position.

16. The fan module of claim 9, wherein the first side support includes an outwardly-extending lip, and wherein the locking body includes an inwardly-extending lip, the inwardly-extending lip of the locking body resting upon the outwardly-extending lip of the first side support when the lever is in the first position.

17. The fan module of claim 16, wherein contact between the lever and the locking body when the lever is moved from the first position to the second position causes the inwardly-extending lip of the locking body to be raised off of the outwardly-extending lip of the first side support.

18. The fan module of claim 1 in combination with a chassis configured to hold one or more fan modules, the fan module being mounted on a floor of the chassis, wherein the locking body is configured to extend through a locking aperture defined in the floor of the chassis when the locking body is in the locked position, and wherein moving the lever from the first position to the second position raises the locking body out of the locking aperture to the unlocked position.

19. A fan module comprising:
- a housing defining a hollow interior configured to house a fan;
- a locking body coupled to the housing and moveable between a locked position and an unlocked position;
- a frame piece coupled to an end of the housing, the frame piece including:
  - a top support;
  - a first side support coupled to a first end of the top support;
  - a second side support coupled to a second end of the top support;
  - at least one upper surface formed by (i) a top end of the first side support, (ii) a top end of the second side support, or (iii) both (i) and (ii); and
  - a lateral surface formed by the top support, the lateral surface being positioned generally perpendicular to the at least one upper surface; and
- a lever pivotably mounted to the frame piece and moveable between a first position and a second position, the lever including a first arm having a proximal end that is pivotably mounted to the first side support of the frame piece, a second arm having a proximal end that is pivotably mounted to the second side support of the frame piece, and a handle coupled to a distal end of the first arm and a distal end of the second arm;
- wherein movement of the lever from the first position to the second position causes the locking body to move from the locked position to the unlocked position.

20. A fan module comprising:
- a housing defining a hollow interior configured to house a fan;
- a locking body coupled to the housing and moveable between a locked position and an unlocked position, the locking body having an inwardly-extending lip;
- a frame piece coupled to an end of the housing, the frame piece including a top support, a first side support coupled to a first end of the top support, and a second side support coupled to a second end of the top support, the first side support including an outwardly-extending lip; and
- a lever pivotally mounted to the frame piece and moveable between a first position and a second position,
- wherein movement of the lever from the first position to the second position causes the locking body to move from the locked position to the unlocked position, and
- wherein the inwardly-extending lip of the locking body rests upon the outwardly-extending lip of the first side support when the lever is in the first position.

* * * * *